(12) United States Patent
Cremer et al.

(10) Patent No.: US 8,179,682 B2
(45) Date of Patent: May 15, 2012

(54) MULTILAYER CIRCUIT BOARD AND USE OF A MULTILAYER CIRCUIT BOARD

(75) Inventors: Dieter Cremer, Neu-Anspach (DE); Reinfried Grimmel, Friedberg (DE)

(73) Assignee: Continental Automotive GmbH, Hannover (DE)

( * ) Notice: Subject to any disclaimer, the term of this patent is extended or adjusted under 35 U.S.C. 154(b) by 299 days.

(21) Appl. No.: 12/678,927

(22) PCT Filed: Sep. 16, 2008

(86) PCT No.: PCT/EP2008/062297
§ 371 (c)(1),
(2), (4) Date: Mar. 18, 2010

(87) PCT Pub. No.: WO2009/037250
PCT Pub. Date: Mar. 26, 2009

(65) Prior Publication Data
US 2010/0208436 A1    Aug. 19, 2010

(30) Foreign Application Priority Data

Sep. 19, 2007 (DE) .......... 10 2007 044 602

(51) Int. Cl.
*H05K 1/00* (2006.01)
*H05K 1/11* (2006.01)
*H05K 1/14* (2006.01)

(52) U.S. Cl. .......... 361/748; 361/794; 361/795

(58) Field of Classification Search .......... 361/760, 361/761, 772, 774, 777, 778, 792, 793, 794, 361/795; 174/250, 261, 262; 257/678, 992, 257/679, 731, 698
See application file for complete search history.

(56) References Cited

U.S. PATENT DOCUMENTS

| | | | | |
|---|---|---|---|---|
| 5,914,864 A * | 6/1999 | MacDonald et al. | ......... | 361/752 |
| 5,987,744 A * | 11/1999 | Lan et al. | .......... | 29/852 |
| 6,077,106 A * | 6/2000 | Mish | .............. | 439/500 |
| 6,404,643 B1 * | 6/2002 | Chung | ............ | 361/737 |
| 6,853,093 B2 * | 2/2005 | Cohen et al. | .......... | 257/678 |
| 7,248,138 B2 * | 7/2007 | Chiang et al. | .......... | 336/200 |
| 7,307,293 B2 * | 12/2007 | Fjelstad et al. | .......... | 257/200 |
| 7,638,875 B2 * | 12/2009 | Chiang | .......... | 257/724 |
| 2002/0129245 A1 * | 9/2002 | Cassagnol et al. | .......... | 713/168 |
| 2004/0120101 A1 | 6/2004 | Cohen et al. | | |
| 2004/0184339 A1 * | 9/2004 | Ozawa | ........... | 365/230.03 |

(Continued)

FOREIGN PATENT DOCUMENTS

DE        694 05 751        1/1998

(Continued)

OTHER PUBLICATIONS

AML (Aktiver Multi Layer); Hofmann Leiterplatten GmbH; Nov. 30, 2006; pp. 1-5; http://www.hofmannlp.de/page/technik_aml.html.

(Continued)

*Primary Examiner* — Lisa Lea Edmonds
*Assistant Examiner* — Xanthia C Cunningham
(74) *Attorney, Agent, or Firm* — Cozen o'Connor

(57) ABSTRACT

A multilayer circuit board having a security cell having security-related electronic components disposed thereon. The security cell is covered by a circuit path arrangement having circuit path segments disposed close to one another, and by an insulation layer. Penetration and thus manipulation of the security-related components is thus largely prevented.

15 Claims, 2 Drawing Sheets

U.S. PATENT DOCUMENTS

| | | | |
|---|---|---|---|
| 2004/0211590 A1* | 10/2004 | Tagi et al. | 174/255 |
| 2006/0023439 A1* | 2/2006 | Fraley et al. | 361/780 |
| 2006/0086534 A1* | 4/2006 | Oggioni et al. | 174/261 |
| 2006/0180344 A1* | 8/2006 | Ito et al. | 174/262 |
| 2006/0291177 A1* | 12/2006 | Choi et al. | 361/780 |
| 2007/0030659 A1* | 2/2007 | Suzuki et al. | 361/793 |
| 2007/0038865 A1* | 2/2007 | Oggioni et al. | 713/178 |
| 2007/0230150 A1* | 10/2007 | Castriotta et al. | 361/794 |
| 2008/0297313 A1* | 12/2008 | Kinkenzeller et al. | 340/10.1 |
| 2009/0041994 A1* | 2/2009 | Ockenfuss et al. | 428/209 |
| 2009/0107712 A1 | 4/2009 | Wimmer et al. | |
| 2009/0185357 A1* | 7/2009 | Rendek et al. | 361/762 |
| 2009/0186169 A1* | 7/2009 | Shacklette et al. | 428/1.6 |
| 2010/0014261 A1* | 1/2010 | Inagaki et al. | 361/763 |
| 2010/0071935 A1* | 3/2010 | Wesselman et al. | 174/251 |

FOREIGN PATENT DOCUMENTS

| | | |
|---|---|---|
| DE | 10 2005 031624 | 1/2007 |
| DE | 10 2005 062 802 | 7/2007 |
| EP | 1 126 358 | 8/2001 |
| EP | 1 432 031 | 6/2004 |
| EP | 1 804 557 | 7/2007 |
| EP | 1804557 A1 * | 7/2007 |
| EP | 1 421 549 | 8/2007 |
| WO | WO 95 01612 | 1/1995 |
| WO | WO 03/019467 | 3/2003 |
| WO | WO 2007/003226 | 1/2007 |

OTHER PUBLICATIONS

AML—Aktiver Multi Layer; data sheet "description of AML", Oct. 5, 2004; pp. 1-4; Hofmann Leiterplatten GmbH, Auerbacher Str. 4, 93057 Regensburg.

\* cited by examiner

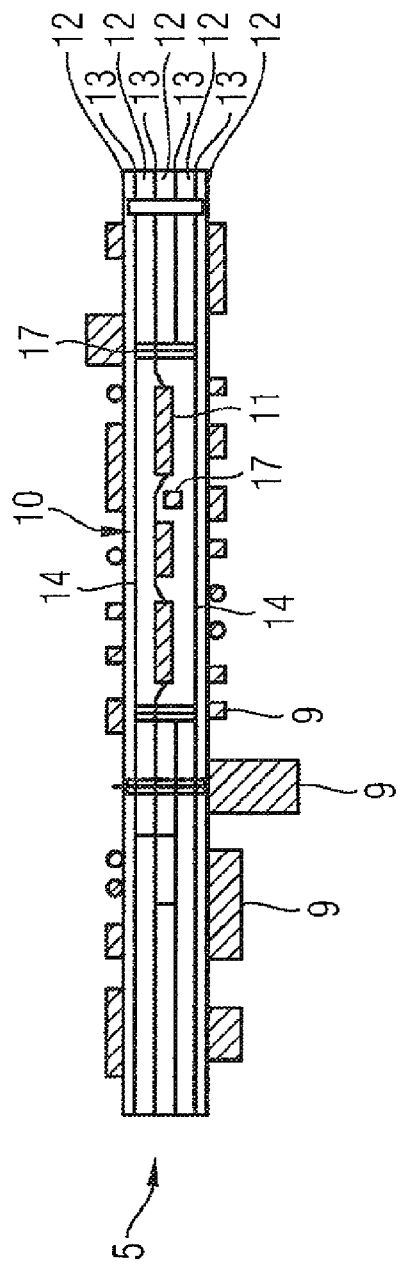
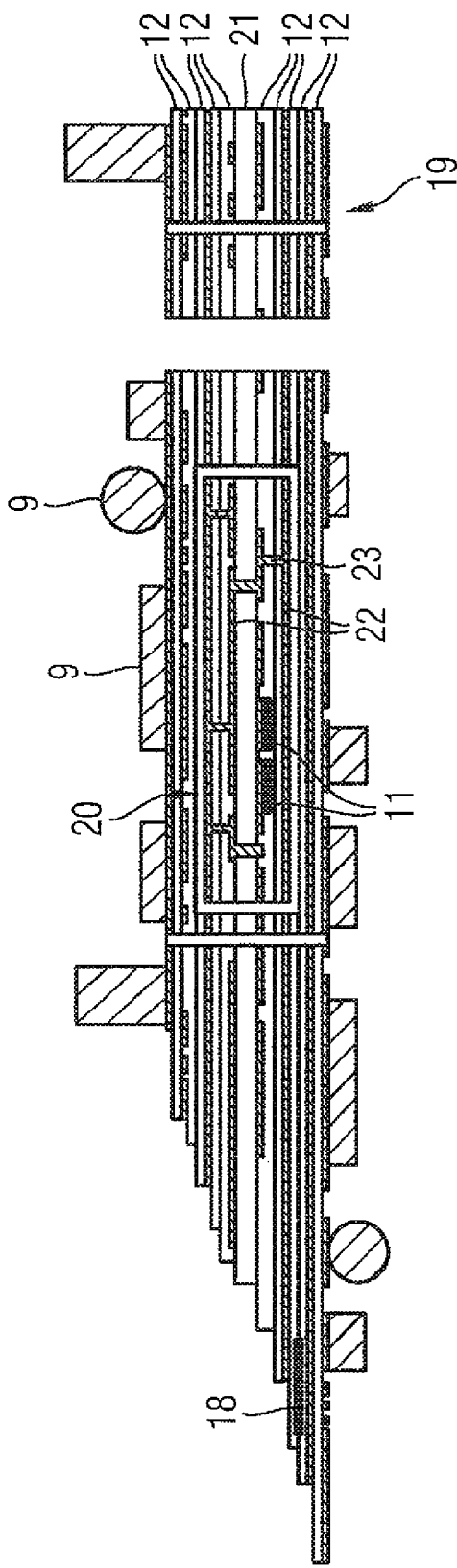

MULTILAYER CIRCUIT BOARD AND USE OF A MULTILAYER CIRCUIT BOARD

PRIORITY CLAIM

This is a U.S. national stage of application No. PCT/EP2008/062297, filed on Sep. 16, 2008, which claims Priority to the German Application No. 10 200 602.2, filed: Sep. 19, 2007; the contents of both which are incorporated here by reference.

BACKGROUND OF THE INVENTION

1. Field of the Invention

The invention relates to a multilayer circuit board comprising a plurality of electronic components arranged on an outer side or within the circuit board, and a plurality of conductor tracks and insulation layers lying one above another in a manner alternating with one another in a sandwich-like manner, the conductor tracks being designed for making contact with the electronic components and insulation layers being designed for isolating the conductor tracks and the electronic components.

2. Prior Art

Such multilayer circuit boards are known in diverse embodiments from the prior art. In the case of these circuit boards, the electronic components can be arranged on the outer side as in the case of known single-layer circuit boards, and in addition also within the circuit board. The components arranged within the circuit board are thereby reliably protected against ambient influences and contact. Protection against contact has the advantage that the arrangement of the electronic components within the circuit board affords a high degree of protection against manipulation. What is disadvantageous in the case of the known circuit boards, however, is that the electronic components arranged within the circuit board are accessible merely by milling the topmost insulation layer and, as a result, can be manipulated or replaced.

SUMMARY OF THE INVENTION

In the case of security-relevant devices it is important that either a manipulation of the hardware can be prevented or a manipulation that has been effected can be detected in a simple manner and be indicated, for example.

The invention is based on developing a multilayer circuit board such that a manipulation is substantially avoided on at least some electronic components. Furthermore, the invention is based on the problem of providing advantageous uses for the multilayer circuit board.

In one embodiment of the invention a security cell comprising electronic components is arranged within the circuit board. The security cell is covered at both end sides by at least one conductor track arrangement, and a distance between conductor track sections of the conductor track arrangement over the security cell is narrower than the dimensioning of the electronic components of the security cell with respect to one another.

This configuration makes it possible to arrange security-relevant electrical components within the security cell. A manipulation of the multilayer circuit board according to the invention has the effect that at least one of the conductor track arrangements covering the security cell is damaged. This damage to the conductor track arrangement can be detected and indicated in a simple manner. As a result, manipulation is substantially avoided to at least some electronic components.

The electronic components arranged within the security cell can be contact-connected by conductor tracks, like all the remaining components.

In accordance with one embodiment of the invention, the security cell is not visible externally if the security cell is covered at both end sides by at least one insulation layer. By this configuration, the manipulation of the electronic components arranged within the security cell is already made more difficult by virtue of the fact that it firstly has to be found in a complicated manner.

The concealed arrangement of the security cell is configured structurally in a particularly simple manner if the conductor track arrangement covering the security cell is covered by insulation layers and conductor tracks of electronic components arranged on the outer side of the circuit board. This configuration leads, moreover, to particularly small dimensions of the multilayer circuit board according to the invention.

In accordance with one embodiment of the invention, damage to the conductor track arrangement covering the security cell can be achieved in a simple manner if the conductor track arrangement covering the security cell is electrically contact-connected. If an attempt is made to penetrate through the conductor track arrangement covering the security cell to the components arranged within the conductor track arrangement, the conductor track arrangement is inevitably damaged due to the narrow distances between the conductor track sections. This damage can be detected in a simple manner by the electrical contact-connection, for example, using suitable software.

In accordance with one embodiment of the invention, the electrical contact-connection of the conductor track arrangement covering the security cell is configured structurally in a particularly simple manner if the conductor track arrangement covering the security cell is incorporated into electrical contact-connections of further components.

In accordance with one embodiment of the invention, reliable protection of the content of the security cell can be achieved in a simple manner if the conductor track sections of the conductor track arrangement are configured in loop-shaped, lattice-like or meandering fashion. By this configuration, the conductor track arrangement produces a conductor pattern over the area of the security cell, which conductor pattern reveals possible influences from outside in a simple manner. As a result, the components arranged within the security cell are particularly reliably protected against manipulation.

In accordance with one embodiment of the invention, a decomposition of the multilayer circuit board according to the invention along the insulation layers below the conductor track arrangement covering the security cell can be avoided in a simple manner if the security cell is delimited laterally by contact bridges extending over a plurality of insulation layers. The contact bridges are preferably likewise electrically connected to further electronic components, such that the severing thereof can be monitored.

The contact bridges could extend through all the layers of the multilayer circuit board. In accordance with one embodiment of the invention, a contribution is made to further reducing the possibility of manipulation if the contact bridges extend exclusively from one conductor track arrangement covering the security cell as far as the other conductor track arrangement covering the security cell. As a result, the contact bridges are also not visible externally. Such contact bridges are often embodied as so-called plated-through holes (microvias) and enable contact to be made with electronic components arranged on different layers.

Radio frequency identification chips, also referred to as RFID chips, are often used for identification purposes. In accordance embodiment of the invention, such chips can be protected against manipulation in a simple manner if a contactlessly readable chip is covered by conductor tracks and insulation layers.

In accordance with another embodiment of the invention, a contribution is made to further increasing the security against a manipulation of a contactlessly readable chip if the contactlessly readable chip is arranged within the security cell.

The second-mentioned problem addressed by the invention, namely that of providing advantageous uses for the multilayer circuit board, is solved according to one embodiment of the invention by the use of the multilayer circuit board in installation devices for motor vehicles, in particular in a tachograph or a toll collection device or in other security-relevant electronics of the motor vehicle.

Particularly in the case of tachographs and toll collection devices of motor vehicles it is necessary to protect the stored data against manipulation and misuse. Software safeguards in the form of cryptographic algorithms or security-technological housings have become known for this purpose from the prior art. To meet international guidelines for protecting the data against misuse, very complicated and cost-intensive techniques are used in the known tachographs and toll collection devices. The so-called RFID chips could often be used here for security-relevant identifications, for example for vehicle data. The configuration of the security cell and of the arrangement of security-relevant electronic components within the security cell makes it significantly more difficult to penetrate to the security-relevant electronic components. The security cell makes it possible, by virtue of its structure, already to prevent the attempt to penetrate to the components with a fault or with a loss of data in the installation device. Due to the invention, the security-relevant electronic components are introduced directly into the structure of the multilayer circuit board and, moreover, possible influences of manipulations are intercepted by the embodiment of the conductor track sections over the security cell.

BRIEF DESCRIPTION OF DRAWINGS

The invention permits numerous embodiments. In order to clarify its basic principle further, two of these embodiments are illustrated in the drawing and are described below. In the drawings:

FIG. 3 is a sectional illustration through the multilayer circuit board along the line III-III and FIG. 4 is a further embodiment of the multilayer circuit board according to an embodiment of the invention.

DETAILED DESCRIPTION OF THE DRAWINGS

Figure 1:
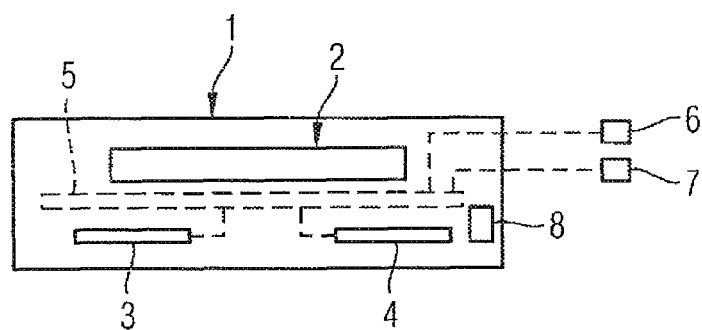
FIG. 1 is an installation device for a motor vehicle comprising a multilayer circuit board according to one embodiment of the invention.

FIG. 1 is an installation device 1 for a motor vehicle comprising a display 2 and comprising receptacles 3, 4 for smart cards (not illustrated). The installation device 1 may be a tachograph or a toll collection device. The installation device 1 has a multilayer circuit board 5. The multilayer circuit board 5 is connected to the display 2, the receptacles 3, 4 for the smart cards and to components 6, 7, such as speed sensors, a position detection device or the like, arranged outside the installation device 1. The installation device 1 furthermore has an operating unit 8 for operating said installation device.

Figure 2:
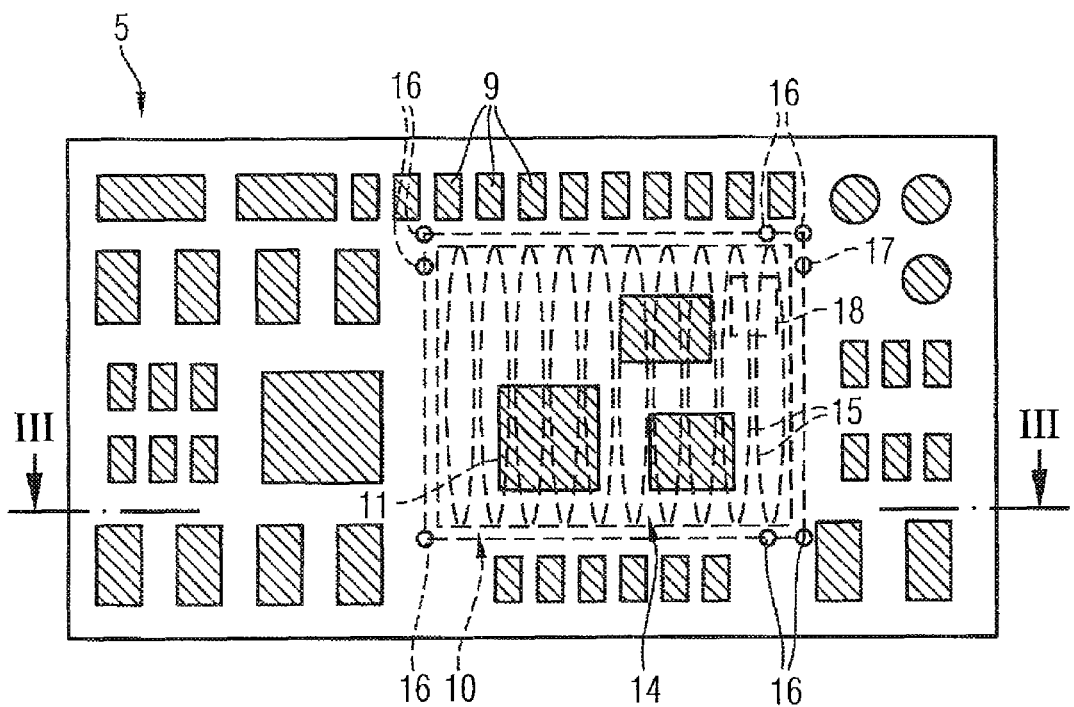
FIG. 2 is a plan view of the multilayer circuit board according to one embodiment of the invention with a security cell arranged therein.

FIG. 2 schematically shows, in enlarged fashion, a plan view of the multilayer circuit board 5 with electronic components 9 arranged thereon. The multilayer circuit board 5 furthermore has a security cell (showed in dashed lines) arranged therein with further electronic components 11 arranged therein.

FIG. 3 is a sectional view through the multilayer circuit board 5 from FIG. 2 along the line III-III The multilayer circuit board 5 has a plurality of insulation layers 12 and layers of conductor tracks 13. A plurality of insulation layers 12 and the layers of conductor tracks 13 are respectively arranged in a manner lying one above another in a sandwich-like manner. The security cell 10 is covered toward the outside by an insulation layer 12, with the result that externally it is not possible to discern where the security cell 10 is situated. The security cell 10 is covered toward both end sides by one of conductor track arrangements 14 illustrated by dashed lines in FIG. 2. Conductor track sections 15 (FIG. 2) of the conductor track arrangements 14 are arranged closer to one another than the width of electronic components 11 arranged within the security cell 10. Furthermore, the conductor track sections 15 are electrically connected to the electronic components 9, 11 and among one another by contact bridges 16 (FIG. 2). If an attempt is made to penetrate to the electronic components 11 arranged within the security cell 10, one or more conductor track sections 15 are inevitably severed. This severing can be made identifiable by a loss of data or a fault in the installation device 1.

The security cell 10 is delimited laterally by contact bridges 16. The contact bridges 16 bridge a plurality of insulation layers 12 and are led as far as the conductor track arrangements 14 covering the security cell 10. The electronic components 11 arranged within the security cell 10 are electrically contact-connected by concealed connections 17, so-called plated-through holes (microvias). The electronic components 11 arranged within the security cell 10 can be, for example, flip-chips or the like. As shown in FIG. 2, a contactlessly readable, RFID chip 18 is arranged within the security cell 10.

FIG. 4 is a sectional view through a multilayer circuit board 19, which differs from that from FIGS. 2 and 3 primarily in that the RFID chip 18 is arranged outside a security cell 20. Furthermore, the multilayer circuit board 19 has a central core 21, on which the electronic components 11 arranged within the security cell 20 are fixed. Here, too, the electronic components 11 are contact-connected by concealed conductor tracks 22 and contact bridges 23. Electronic components 9 arranged on the outer sides of the multilayer circuit board 19 are arranged above the security cell 20, which makes it more difficult to penetrate to the security cell 20. The security cell 20 is constructed like the security cell from FIGS. 2 and 3.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. An assembly comprising:
   a plurality of electronic components;
   a multilayer circuit board having a plurality of conductor tracks and insulation layers lying one above another in an alternating manner in a sandwich-like manner configured to have the plural electronic components arranged at least one of on an outer side of the multilayer circuit board and within the multilayer circuit board, the conductor tracks configured to make contact with the electronic components and the insulation layers configured to isolate the conductor tracks and the electronic components; and
   a security cell comprising at least one of the plural electronic components arranged within the circuit board, the security cell covered at both end sides by at least one conductor track arrangement having a plurality of track sections, a distance between the plural conductor track sections of the conductor track arrangement over the security cell being narrower than a dimension of the at least one electronic component in the security cell.

2. The assembly as claimed in claim 1, wherein the security cell is covered at the both end sides by at least one insulation layer.

3. The assembly as claimed in claim 2, wherein the conductor track arrangement covering the security cell is covered by at least one insulation layer and at least one conductor tracks of the electronic components arranged on the outer side of the circuit board.

4. The assembly as claimed in claim 1, wherein the conductor track arrangement covering the security cell is covered by at least one insulation layer and at least one conductor track of the electronic components arranged on the outer side of the circuit board.

5. The assembly as claimed in claim 1, wherein the conductor track arrangement covering the security cell is electrically contact-connected.

6. The assembly as claimed in claim 5, wherein the conductor track arrangement covering the security cell is configured to provide electrical contact-connections for further components.

7. The assembly as claimed in claim 1, wherein the conductor track sections of the conductor track arrangement are configured in at least one of a loop-shape, a lattice-like shape, and a meandering fashion.

8. The assembly as claimed in claim 1, wherein the security cell is delimited laterally by contact bridges extending over a plurality of the plural insulation layers.

9. The assembly as claimed in claim 8, wherein the contact bridges extend from one conductor track arrangement covering the security cell as far as the other conductor track arrangement covering the security cell.

10. The assembly as claimed in claim 1, wherein a contactlessly readable chip is covered by at least one conductor track and at least one insulation layer.

11. The assembly as claimed in claim 10, wherein the contactlessly readable chip is arranged within the security cell.

12. The assembly as claimed in claim 11, wherein the contactlessly readable chip is an RFID chip.

13. The assembly as claimed in claim 1, wherein the assembly is installed in a device for a motor vehicle.

14. The assembly as claimed in claim 1, wherein the assembly is installed in at least one of a tachograph, a toll collection device, and a security-relevant electronics of a motor vehicle.

15. The assembly as claimed in claim 1, wherein the a security cell comprises at least two of the plural electronic components and the distance between the plural conductor track sections of the conductor track arrangement over the security cell are narrower than a spacing dimension of the at least two electronic component in the security cell with respect to each other.

* * * * *